United States Patent [19]

Napoli et al.

[11] Patent Number: 4,731,155
[45] Date of Patent: Mar. 15, 1988

[54] PROCESS FOR FORMING A LITHOGRAPHIC MASK

[75] Inventors: Louis S. Napoli, Hamilton Township, Mercer County; John P. Russell, Pennington, both of N.J.

[73] Assignee: General Electric Company, Schenectady, N.Y.

[21] Appl. No.: 40,401

[22] Filed: Apr. 15, 1987

[51] Int. Cl.$^4$ .................. B44C 1/22; C03C 15/00; C03C 25/06; B29C 37/00
[52] U.S. Cl. .................................. 156/643; 156/645; 156/646; 156/652; 156/655; 156/657; 156/659.1; 156/662; 156/668
[58] Field of Search ............... 156/643, 645, 646, 652, 156/655, 657, 659.1, 662, 668, 209, 219, 220; 430/313, 323, 330; 427/38, 39, 43.1, 271

[56] References Cited

U.S. PATENT DOCUMENTS

| | | | |
|---|---|---|---|
| 3,923,566 | 12/1975 | Law | 156/645 X |
| 4,357,369 | 11/1982 | Kilichowski et al. | 156/668 X |
| 4,670,095 | 6/1987 | Negishi | 156/668 X |

*Primary Examiner*—William A. Powell
*Attorney, Agent, or Firm*—James M. Trygg; Allen LeRoy Limberg

[57] ABSTRACT

A process is provided for forming a patterned layer of a polymeric material on a substrate for the lithographic processing thereof. A layer of polymeric material is formed on the substrate, embossed to form a pattern of peaks and valleys and dry etched to remove the residual polymeric material in the valleys, thereby exposing a portion of the substrate surface.

14 Claims, No Drawings

PROCESS FOR FORMING A LITHOGRAPHIC MASK

This invention relates to the formation of a patterned layer of polymeric material for the lithographic processing of the underlying substrate.

BACKGROUND OF THE INVENTION

Resist materials and their use in the lithographic processing of substrates, such as silicon wafers, are well known in the electronics industry. In conventional lithographic processing, a substrate is coated with one or more layers of material, at least one of which is radiation sensitive. The radiation sensitive material is generally organic in nature and is typically polymeric. The structure is pattern irradiated with a source of radiation such as light, electron beam, x-ray, gamma ray and the like. The irradiation alters the solubility of the sensitive layer in a developer solvent, or the resistance thereof to a plasma.

Development of the sensitive layer by a solvent, or plasma, will remove either the irradiated or the nonirradiated portion thereof, thus forming a patterned mask for the lithographic processing, e.g., etching, pattern deposition, ion implantation and the like, of the underlying substrate.

There are a number of disadvantages associated with resist lithography which are likewise well known. These include resolution limitations with certain processing techniques, cost of equipment for techniques such as electron beam or ion beam irradiation, loss of pattern definition due to separation of a portion of the radiation sensitive layer from the substrate during development and/or subsequent processing, and the like. A further problem inherent in conventional lithographic techniques is loss of pattern resolution due to backscattering of the irradiation from the substrate into nonirradiated portions of the resist. This can be particularly troublesome, for example, in patterning of a photoresist over a highly reflective substrate, such as aluminum. In addition to backscattering, irradiation with an electron beam can produce a charge build-up in the resist layer which can cause aiming errors and pattern misalignment. These problems are conventionally addressed by adding additional layers of material to the resist structure to absorb backscattering radiation or dissipate charge build-up.

There is an ongoing search for new resist materials, or materials which can be incorporated into conventional resist structures, which will provide improvement in one of these problem areas, e.g., improved adhesion to the substrate or greater contrast, i.e., differential solubility or etchability of the irradiated vs. the nonirradiated portion of the resist layer, without material sacrifice of other desirable properties. There is also considerable interest in new solvents, etch gas mixtures, processing conditions and the like which will improve known resist materials.

In accordance with this invention, a lithographic process is provided which does not require an irradiation step and which is applicable to polymeric materials not presently regarded as useful in lithographic processing.

SUMMARY OF THE INVENTION

A lithographic pattern is formed on a substrate by providing a layer of thermoplastic material thereover, embossing a relief pattern therein and etching the patterned layer in a suitable plasma to remove the thin portion thereof, thus exposing the substrate.

DETAILED DESCRIPTION OF THE INVENTION

The substrate upon which a patterned layer of material is formed in accordance with this invention may be any suitable material, for example, single crystalline silicon, gallium arsenide, tungsten, polycrystalline materials with suitable surfaces, vitreous materials or the like. The substrate may be appropriately doped to provide regions of varying conductivity. Topographical features on the substrate, if present, typically are silicon islands, mesas, devices, device subassemblies, circuit components and the like, and may be of the same or a material different from that of the substrate. The exact nature of such features is not critical to the invention with the exception that they have to withstand the conditions necessary to form a patterned layer by the subject process.

In accordance with this invention, a single layer of a suitable thermoplastic resin is coated onto the substrate. It is desirable, although not necessary, that the resin have some planarizing capability if the substrate has topographical features. The resin may be applied to the substrate in any conventional manner, such as dipping, brushing, spraying, release tape and the like, with spin-coating being particularly suitable. The coating is then heated to an appropriate temperature to drive off a solvent, if present, or to cure a liquid monomer, thereby forming a polymer layer.

The thickness of the polymer layer will vary depending on a number of factors such as the type of polymer being utilized, the dimensions of the pattern to be embossed therein, the etch rate of the polymer in comparison to that of the underlying material, if it is to be etched, and the like. In general, it is contemplated that the thickness of the polymer layer, measured over a flat surface, is between about 0.5 and 1.5, preferably about 1.0 micrometers. It is further contemplated that the substrate can be coated on two major surfaces which can be processed simultaneously. For example, a six inch silicon wafer, typically from about 25 to 30 mils thick, can be processed on both sides and then cut longitudinally to form two substrates. The wafer can be longitudinally cut at any desired stage in the processing, or after all processing has been carried out. The economic advantage of the subject process in this regard is readily appreciated.

The resin utilized in the subject process must meet a number of criteria. First, the resin must be stable up to processing temperatures during embossing, which may range from 100° to 250° C. and perhaps beyond. The resin material must adhere well to the substrate being processed, preferably have planarizing capabilities, have low distortion, i.e., shrinkage and warpage, and be reasonably etch resistant. The etch resistance requirement of the resin is two-fold. First, since the resin material which remains in the thin portion or "valleys" of the embossed pattern is compacted and densified to a degree, it is possible that it will etch at a slower rate than the thick portion or "peaks" of the pattern. The amount of compaction and change in etch rate, if any, will vary with the polymer being utilized. In order for a resin to be useful in the process of this invention, it is necessary that the etch rate of the resin in the valleys be such that it can be removed before an unsatisfactory amount of the resin in the peaks is removed.

Second, there must be a sufficient difference in the etch rate of the resin and the underlying substrate in a given etchant so that etching of the substrate can be carried out without any loss of pattern resolution. It will be appreciated that this statement is equally applicable to other processing of the underlying substrate, such as ion implantation and the like. Finally, although it is critical that the resin pattern remain in place during all processing steps without loss of pattern, it must be cleanly removable when processing is completed.

Resins which can be utilized in the process of this invention include, for example, homopolymers of vinyl chloride, styrene, esters of acrylic or methacrylic acids, copolymers thereof and copolymers with other monomers, e.g., styrene/acrylonitrile, polyimides polycarbonates and the like. By "esters" of acrylic acid or methacrylic acid is meant generally lower alkyl and lower alkenyl esters, particularly methylmethacrylate and ethylmethacrylate. Mixtures of the above homopolymers and/or copolymers in any proportion are likewise contemplated. In general, the resins are applied to the substrate as a solution in a suitable solvent, e.g., an organic solvent such as propyleneglycol methyl ether acetate, available from Dow Corporation under the trademark Dowanol PMA, ethylene glycol ethyl ether acetate, cyclohexanone and the like. The resins may be dissolved in a liquid monomer which also contains one or more conventional polymerization catalysts, such as a benzophenone- or benzoguinone-type free radical initiator. The composition is applied to the substrate and treated, e.g., irradiated, heated or the like, to polymerize the monomer in situ. A composition of one or more monomers is treated in a like manner.

The layer of resin covering the substrate to be processed is embossed utilizing known equipment, e.g., hot roller or press embossing apparatus. Care must be taken not to exceed the temperature stability and pressure stability limits of the resin or the substrate. In general, a temperature of from about 100° to 400° C. and a pressure of from about 10 to 400 p.s.i. are contemplated. The masters utilized for the pattern are typically a metal such as nickel or an alloy thereof. Chromium plated nickel is also suitable as a master. Techniques are known whereby such pattern masters having relief variations as small as 0.6 micrometer can be formed. For example, Halter in U.S. Pat. No. 4,044,379 discloses an electromechanical process for forming such relief patterns as masters for producing capacitive electronic discs. It is possible to emboss a pattern in a resin layer overlying a substrate having surface typography by appropriate design of the relief structure of the master to accommodate existing topography. As stated previously, it is within the scope of the present invention to emboss pattern layers of resin on opposite major surfaces of a flat substrate of appropriate thickness so that it could be cut transversely to form two substrates.

After embossing of the resin layer is complete, the master is withdrawn and the valleys etched to remove the resin therein and expose the substrate. It is preferred to disengage the master from the resin before the latter has had the opportunity to cool appreciably as this minimizes the tendency of the resin to adhere to the master. It is likewise preferred to coat the master with a conventional release agent, such as a thin layer of poly(tetrafluoroethylene).

The etching of the resin in the valleys of the patterned resin is suitably carried out with an oxygen plasma or a mixture of oxygen and another gas such as nitrogen or argon. A hydrogen etch may likewise be utilized. The choice of the etchant gas and conditions are considered to be within the skill of the art. It is advantageous for the etch to be anisotrophic. If the resin in the bottom of the valleys is easily removed, an isotropic etch may be utilized, taking into consideration the effect on the desired pattern. In the event that the sidewalls of the pattern are tapered, it will be necessary to utilize an anisotropic etch mixture.

After the valleys of the pattern have been etched, the exposed substrate is treated, e.g., by etching, deposition, ion implantation and the like. In the event that the plasma being utilized to clean the valleys of the pattern etches the substrate at a significantly faster rate than the resin, etching may simply be continued until the desired etching of the substrate has been carried out. Typically, however, the plasma mixture will be changed to one which will produce a sufficient disparity in etch rates between the pattern and the substrate to enable the desired procedure to be carried out without loss of resolution resulting from total erosion of the pattern.

Prior to carrying out the contemplated procedure on the substrate, the resin pattern may be conventionally treated to enhance the efficacy thereof. For example, the resin pattern may be baked to harden it and/or increase the adhesion thereof to the substrate. The surface of the pattern may be conventionally treated by solvent or plasma to render it more impervious to the contemplated etching plasma or implantation procedure. It will be appreciated, however, that the choice of such a treatment must be weighed with regard to the effect thereof on the exposed surface of the substrate, i.e., if a plasma treatment produces a film on the substrate surface which is also more difficult to etch, the use of the plasma to retard the etch rate of the resin pattern may be of little benefit. The pretreatment of the pattern is likewise not suitable if it makes the pattern difficult to remove after the processing of the substrate is completed. Removal of the pattern is carried out conventionally, e.g., with an organic solvent.

The process of forming a patterned layer of a resin for lithographic processing of an underlying substrate provided in accordance with this invention is advantageous over prior techniques in a number or respects. Significant among these are the elimination of need for high-priced irradiation equipment and the loss of resolution resulting from back scattering of radiation from the substrate. Lithographic processing is carried in accordance with the subject invention with a single layer of resin in contrast to the multilayer resist structures commonly used in the electronics industry. This reduces process steps and eliminates problems inherent in the commingling of such layers.

The following Example further illustrates this invention, it being understood that the invention is in no way intended to be limited to the details described therein. In the Example, all parts and percentages are on a weight basis and all temperatures are in degrees Celsius, unless otherwise stated.

EXAMPLE

Glass substrates 50×50 mm were spin-coated with a 6 percent solution of poly(methylmethacrylate) in ethylene glycol monomethyl ether acetate. The coating was allowed to dry and then baked at 95° C. for thirty minutes to remove residual solvent, leaving a layer one micrometer in thickness.

The resin layer was embossed with nickel masters containing uniform rectangular grating patterns of 2, 0.85 and 0.7 micrometer wide peaks and valleys having verticle sides. The master was coated with a thin layer of poly(tetrafluoroethylene) having a thickness of about 40 nm. The embossing was carried out at a pressure of approximately 75 p.s.i. and a temperature of about 150° C. The master was separated from the film after it had been allowed to cool to approximately 80° C. There were obtained clear relief patterns in each instance. The thickness of the resin in the valleys varied between about 0.2 and 0.3 micrometer.

The patterns were dry etched by reactive ion etching in an oxygen plasma at 50 milliwatts, 30 millitorr and 20 sccm. The residual resin in the valleys was removed in about 4 minutes with an approximately equal loss in the thickness of the desired pattern. The etch under these conditions was somewhat isotropic leading to a slight reduction in line width. This can be corrected by varying the conditions and the etch mixture. There was produced a well defined grating pattern in each instance. There was no discernible separation of the pattern from the substrate.

What is claimed is:

1. A process of forming a patterned layer on a substrate for the lithographic processing of the substrate comprising: providing a layer of an embossable polymeric material on the substrate; embossing a surface relief pattern in said layer; and dry etching said patterned layer to remove the thin portion thereof, thus exposing a corresponding portion of the substrate.

2. A process in accordance with claim 1, wherein the embossable polymeric material is a thermoplastic resin.

3. A process in accordance with claim 2, wherein the thermoplastic resin is selected from the group consisting of homopolymers of vinyl chloride, styrene, esters of acrylic acid or methacrylic acid, copolymers thereof, copolymers thereof with other monomers, polyimides and polycarbonates.

4. A process in accordance with claim 3, wherein the resin is poly(vinyl chloride).

5. A process in accordance with claim 3, wherein the resin is poly(methylmethacrylate).

6. A process in accordance with claim 1, wherein the polymeric layer is embossed with a master comprised of nickel, an alloy thereof, or chromium plated nickel.

7. A process in accordance with claim 6, wherein the master is coated with a release agent.

8. A process in accordance with claim 7, wherein the release agent is a layer of poly(tetrafluoroethylene).

9. A process in accordance with claim 1, wherein the thin portion of the surface relief pattern of the polymeric layer is removed by plasma etching.

10. A process in accordance with claim 9, wherein said portion is removed by etching in an oxygen-containing plasma.

11. A process in accordance with claim 10, wherein the oxygen-containing plasma is an oxygen plasma.

12. A process in accordance with claim 1, wherein the substrate has two major surfaces and the patterned layer is formed on both surfaces.

13. A process in accordance with claim 12, wherein the patterned layer is formed on both surfaces simultaneously.

14. A process in accordance with claim 1, additionally including the step of baking the patterned layer after removal of the thin portion thereof.

* * * * *